United States Patent
Minawati et al.

(10) Patent No.: US 10,622,279 B1
(45) Date of Patent: Apr. 14, 2020

(54) HEATSINK MOUNTING SYSTEM WITH OVERHANG DAMPING

(71) Applicant: CISCO TECHNOLOGY, INC., San Jose, CA (US)

(72) Inventors: . Minawati, San Jose, CA (US); Vic Hong Chia, Sunnyvale, CA (US); Phillip S. Ting, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/247,218

(22) Filed: Jan. 14, 2019

(51) Int. Cl.
*H01L 23/40* (2006.01)
*H01L 23/427* (2006.01)

(52) U.S. Cl.
CPC ........ *H01L 23/4006* (2013.01); *H01L 23/427* (2013.01); *H01L 2023/4087* (2013.01)

(58) Field of Classification Search
CPC .................................................. H05K 7/2039
See application file for complete search history.

(56) References Cited

U.S. PATENT DOCUMENTS

| 4,214,738 | A | * | 7/1980 | Casper | F16F 1/3732 |
| | | | | | 248/573 |
| 6,829,143 | B2 | | 12/2004 | Russell et al. | |
| 7,064,957 | B1 | | 6/2006 | Liang et al. | |
| 7,474,532 | B1 | | 1/2009 | Desrosiers et al. | |
| 7,509,710 | B1 | * | 3/2009 | Lin | H04M 1/0216 |
| | | | | | 16/337 |
| 7,580,262 | B2 | * | 8/2009 | Chou | G06F 1/20 |
| | | | | | 165/104.26 |
| 7,835,153 | B2 | * | 11/2010 | Kearns | H01L 23/40 |
| | | | | | 165/185 |
| 8,619,426 | B2 | | 12/2013 | Chamseddine et al. | |
| 2018/0339592 | A1 | * | 11/2018 | Aubry | B60K 37/06 |
| 2019/0200479 | A1 | * | 6/2019 | Yatskov | H05K 7/2039 |

* cited by examiner

*Primary Examiner* — Mukundbhai G Patel
(74) *Attorney, Agent, or Firm* — Cindy Kaplan

(57) ABSTRACT

In one embodiment, a heatsink mounting system includes a plurality of fasteners for attaching the heatsink to a circuit board at a location proximate to an electronic component interposed between the circuit board and the heatsink and a damping connector for attaching an overhang portion of the heatsink to the circuit board. The damping connector includes a first O-ring for positioning adjacent to an upper surface of a base of the heatsink, a second O-ring for positioning adjacent to a lower surface of the base, and a connecting member extending through aligned openings in the O-rings and the base of the heatsink. The damping connector is operable to absorb energy during vibration or shock at the heatsink to prevent flexing of the heatsink.

17 Claims, 6 Drawing Sheets

US 10,622,279 B1

HEATSINK MOUNTING SYSTEM WITH OVERHANG DAMPING

TECHNICAL FIELD

The present disclosure relates generally to heatsinks, and more particularly, to heatsink damping.

BACKGROUND

Over the past several years, there has been a tremendous increase in the need for higher performance communications networks. Increased performance requirements have led to an increase in energy use resulting in greater heat dissipation from components. Heatsinks are widely used to accommodate the large thermal dissipation of many semiconductor devices. High power components such as ASICs (Application Specific Integrated Circuits) require larger high performance heatsinks, which are sensitive to bowing under shock and vibration conditions.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
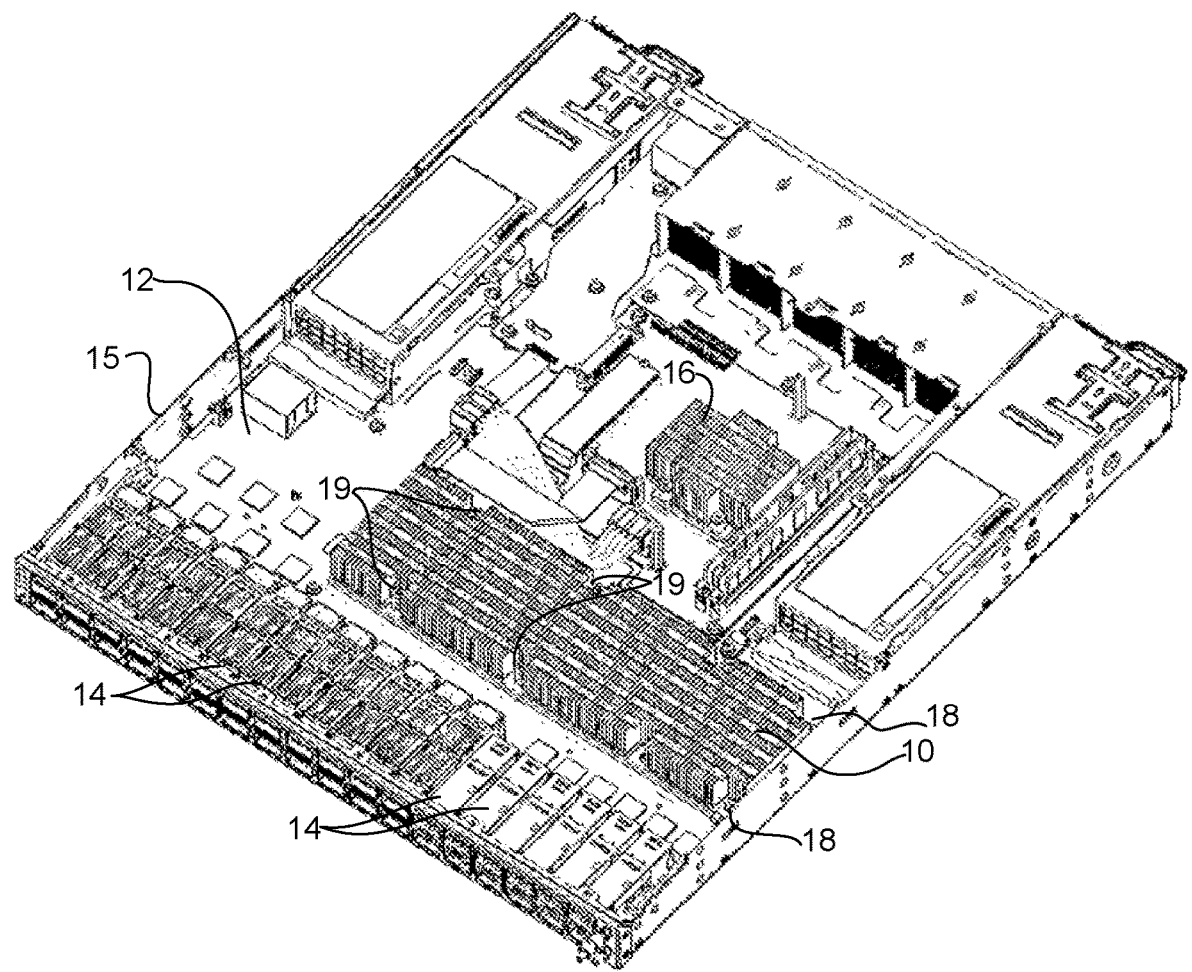
FIG. 1 is a perspective illustrating an example of a heatsink mounted on a circuit board.

In one embodiment, a heatsink mounting system generally comprises a plurality of fasteners for attaching the heatsink to a circuit board at a location proximate to an electronic component interposed between the circuit board and the heatsink and a damping connector for attaching an overhang portion of the heatsink to the circuit board. The damping connector comprises a first O-ring for positioning adjacent to an upper surface of a base of the heatsink, a second O-ring for positioning adjacent to a lower surface of the base of the heatsink, and a connecting member for extending through aligned openings in the O-rings and the base of the heatsink. The damping connector is operable to absorb energy during vibration or shock at the heatsink to prevent flexing of the heatsink along a length of the heatsink.

In one or more embodiments, the connecting member comprises two mating connectors each comprising a shoulder for supporting the O-ring.

In one or more embodiments, the O-rings are installed in an uncompressed state to provide zero static load on the heatsink.

In one or more embodiments, the fasteners comprise four spring loaded screws and the damping connector comprises two damping connectors positioned along an edge of the overhang portion of the heatsink.

In one or more embodiments, the heatsink base comprises a two-phase device to remove heat generated by the electronic component. The two-phase device may comprise a vapor chamber.

In one or more embodiments, the heatsink comprises a plurality of fins extending from the base and the damping connector comprises two damping connectors positioned at corners of the overhang portion of the heatsink and aligned with a recessed portion of the fins.

In one or more embodiments, the heatsink has an aspect ratio of width to length of at least one to three.

In another embodiment, an apparatus comprises a heatsink, a plurality of fasteners for attaching the heatsink to the circuit board at a location proximate to an electronic component interposed between the circuit board and the heatsink, and a damping connector for attaching an overhang portion of the heatsink to the circuit board. The damping connector comprises a first O-ring adjacent to an upper surface of a base of the heatsink, a second O-ring adjacent to a lower surface of the base of the heatsink, and a connecting member extending through aligned openings in the O-rings and base of the heatsink. The damping connector is operable to absorb energy during vibration or shock at the heatsink to prevent flexing of the heatsink along a length of the heatsink.

In yet another embodiment, an apparatus comprises a circuit board, a heatsink mounted on the circuit board, a plurality of fasteners attaching the heatsink to the circuit board at a location proximate to an electronic component interposed between the circuit board and the heatsink, and a damping connector attaching an overhang portion of the heatsink to the circuit board. The damping connector comprising a first O-ring adjacent to an upper surface of a base of the heatsink, a second O-ring adjacent to a lower surface of the base of the heatsink, and a connecting member extending through aligned openings in the O-rings and base of the heatsink and attached to the circuit board. The damping connector is operable to absorb energy during vibration or shock at the heatsink to prevent flexing of the heatsink along a length of the heatsink.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

High power components such as ASICs (Application Specific Integrated Circuits) often need larger high performance heatsinks, which may include two-phase cooling components such as vapor chambers or heat pipes to quickly dissipate and spread excessive heat to fins, which are cooled via forced airflow. Lower performance heatsinks are typically smaller and shaped so that the heatsink can be symmetrically positioned over an electronic component. As such, a downward force created due to coupling of the heatsink to a circuit board is evenly distributed over the electronic component, which prevents the heatsink from undergoing structural deformation and allows for optimal heat transfer. Due to growing power requirements and corresponding cooling requirements for electronic components, heatsinks are increasing in size and complexity so that when the heatsink is coupled to the circuit board, the heatsink is no longer symmetrical relative to the underlying electronic component. Limited board space and electrical component constraints often results in an asymmetrical layout of the heatsink, which increases attachment challenges due to a cantilever effect. A challenge with larger high performance heatsinks is therefore not just the heat transfer but also the mechanical integrity of the heatsink due to the size, weight, and shape. For example, the sensitivity of vapor chamber heatsinks or other high performance heatsinks is highly correlated to the overall flatness of the heatsink. When the heatsink aspect ratio is large (e.g., 1 to 3 ratio of width to length or other ratio), the heatsink may be subject to bowing (flexing along the length of the heatsink). The vapor chamber heatsink may be particularly prone to bowing due to the weight and thin structure of its base. The bowing may lead to damage of fluid cooling components (e.g., vapor chamber, heat pipes) in the heatsink and BGA (Ball Grid Array) cracking on the circuit board and electrical component connections, for example.

In order to prevent bowing, asymmetrical heatsinks may be attached to the circuit board using additional mounting points to distribute loading across a larger area. However, this takes up valuable printed circuit board space. Also, the asymmetrical layout relative to the underlying electrical component prevents the even distribution of downward force with conventional mountings. A portion of the heatsink extending beyond the electronic component (referred to herein as an overhang portion) needs to be secured to the circuit board in order to meet shock and vibration requirements, maintain optimum flatness of the heatsink base, and ensure heatsink thermal performance, while having minimal impact on circuit board layout due to mounting holes.

The embodiments described herein comprise a heatsink mounting system for attaching a heatsink to a circuit board and providing damping support to an overhang portion of the heatsink that does not directly cover an electronic component over which the heatsink is positioned. In one or more embodiments, damping is provided through a pair of O-rings (compressible members/elements) located on a top and bottom side of a heatsink base to absorb a cantilever force during shock and vibration.

Referring now to the drawings, and first to FIG. 1, an example of a heatsink 10 mounted on a circuit board (e.g., printed circuit board) 12 is shown. The heatsink 10 transfers heat generated by an electronic component such as a semiconductor device (e.g., ASIC) where heat dissipation capability of the component is insufficient to moderate its temperature. As described in detail below, the heatsink 10 includes a base and fins, which allow excess thermal energy to dissipate into the environment by conduction and convection. The heatsink 10 is configured to maximize the surface area in contact with a cooling medium (e.g., air) surrounding the heatsink. The heatsink 10 may be formed from any suitable material (e.g., copper, aluminum, or other material) having relatively high heat conduction characteristics to allow heat transfer from the electronic component to the heatsink and have any shape (e.g., height, width, length, ratio of width to length, base footprint, base thickness, number of fins, size of fins). In one or more embodiments, the heatsink 10 comprises a two-phase device (e.g., vapor chamber, heat pipes) to improve thermal performance. The vapor chamber or heat pipes may be located in the base of the heatsink, for example. The two-phase device transfers heat through the phase change of liquid to vapor and back to liquid, with the liquid passively pumped from condenser to evaporator by capillary action.

As shown in the example of FIG. 1, the circuit board (e.g., printed circuit board) 12 may comprise any number of optical modules 14, asymmetric heatsink 10, symmetric heatsink 16, electronic components, interfaces, or other components (e.g., fan, power supply). The printed circuit board 12 provides a dielectric material for copper or other conductive traces. The traces and pads are embedded within or deposited on the printed circuit board 12 for connection with the electronic components. Etching, deposition, bonding, or other processes may be used to form the traces, pads, or embedded components (e.g., passive or active devices). The printed circuit board 12 may include one or more active devices (e.g., transistor, chip, processor, circuit, application specific integrated circuit, field programmable gate array, memory, etc.) and one or more passive devices (e.g., capacitor, resistor, inductor, connector, via, pad, etc.). Vias may be provided for routing traces through layers of the printed circuit board. The traces, pads, and electronic components may be arranged in any configuration to perform any number of functions (e.g., network server card, graphics card, motherboard, device card (line card, fabric card, controller card), and the like) for operation on any type of network device (e.g., computer, router, switch, server, gateway, controller, edge device, access device, aggregation device, core node, intermediate node, or other network device). The circuit board 12 may be contained within a frame 15 and located within a line card, fabric card, controller card, or other modular device, including, for example, 1RU (rack unit), 2RU, or other size modular devices. The network device may operate in the context of a data communications network including multiple network devices that communicate over one or more networks.

As described below with respect to FIG. 2, the heatsink 10 is asymmetrically positioned over an electronic component (e.g., ASIC) due to its size in order to support cooling capacity provided by a high performance heatsink. Damping connectors 18 support an overhang portion of the heatsink 10 and provide damping to reduce amplitude or vibration quickly and effectively. The mounting system further includes fasteners (e.g., spring loaded screws) 19 used to mount a symmetric portion of the heatsink to provide contact between the electronic component and the heatsink 10.

Figure 2:
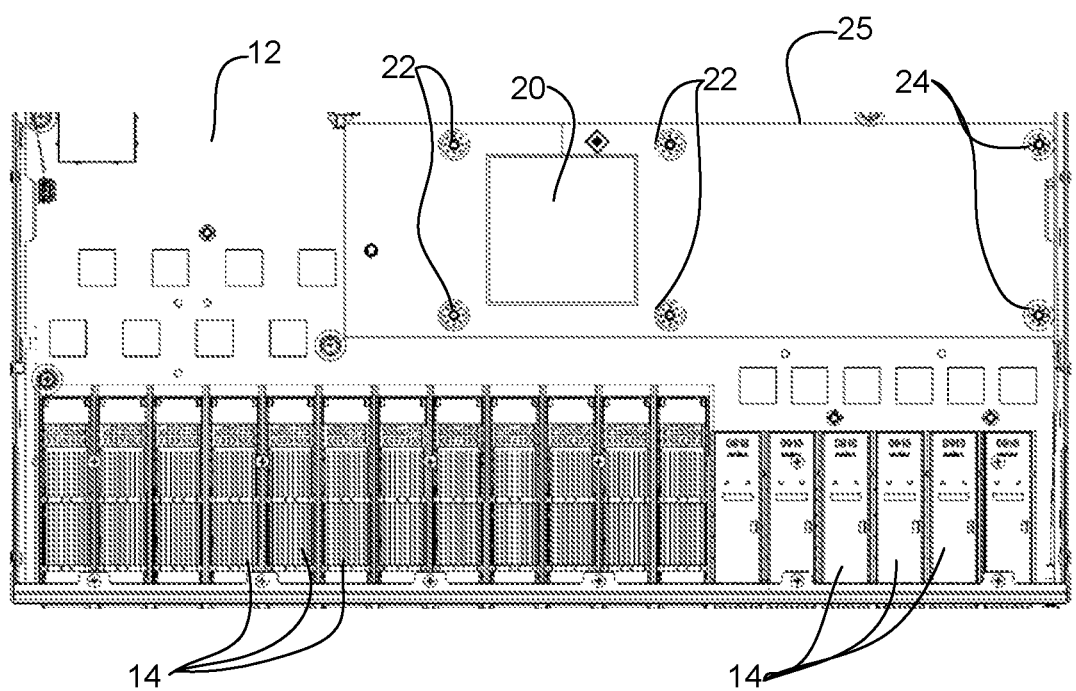
FIG. 2 is a partial top view of the circuit board of FIG. 1 with the heatsink removed.

FIG. 2 is a partial top view of the circuit board 12 of FIG. 1 showing an electronic component (e.g., ASIC) 20 positioned below the heatsink 10 (FIG. 1), with the heatsink removed to show mounting details relative to the ASIC. An outline of the removed heatsink is indicated at 25 in FIG. 2. As illustrated in FIG. 2, the heatsink has an asymmetrical layout relative to the underlying ASIC 20. Mounting holes 22 are used to mount a symmetric portion of the heatsink 10 to the circuit board at a location proximate to the electronic component 20 interposed between the heatsink and the circuit board 12. As noted above with respect to FIG. 1, spring loaded screws 19 (or other suitable fasteners) may be used to mount the heatsink to the circuit board 12 at mounting holes 22. The fasteners 19 used to couple the heatsink 10 to the circuit board 12 at mounting locations 22 (FIGS. 1 and 2) create a downward coupling force (where the downward direction is defined as a direction from the heatsink 10 to the circuit board 12). For optimal heat transfer, the location and spring force on the fasteners 19 are calculated such that uniform force spreads evenly across the ASIC 20.

In order to counter the asymmetrical downward coupling force created due to the asymmetrical layout of the heatsink over the ASIC 20, one or more damping connectors are provided to counter the downward force. In the example shown in FIGS. 1 and 2, two damping connectors 18 are installed at mounting locations 24. In this example, the damping connectors 18 are positioned along an edge of the overhang portion of the heatsink. The damping connectors 18 may also be located closer to the ASIC 20, however, the connectors should not be positioned too far from the edge to prevent another overhang portion that is free to flex under vibration and shock.

It is to be understood that the heatsink 10 and circuit board 12 described above and shown in FIGS. 1 and 2 are only examples and that the heatsink mounting system described herein may be used to attach any type of heatsink to any substrate supporting electronic components. The circuit board may be any type of conductive platform or board for installing and electrically connecting electrical and mechanical components to create an electrical circuit. The circuit board may be securely positioned within a housing and have one or more electronic chips (e.g., ASIC or other electronic component, microchip, or integrated circuit) installed thereon. One or more heatsinks may be attached to the circuit board and positioned over one or more heat generating electronic components. The heatsink mounting system described herein may be used to mount one or more heatsinks to the circuit board.

Also, it should be noted that the terms, downward, upward, bottom, top, lower, upper, below, above, and the like as used herein are relative terms dependent upon orientation of the printed circuit board and network device and should not be interpreted in a limiting manner. These terms describe points of reference and do not limit the embodiments to any particular orientation or configuration.

Figure 3:
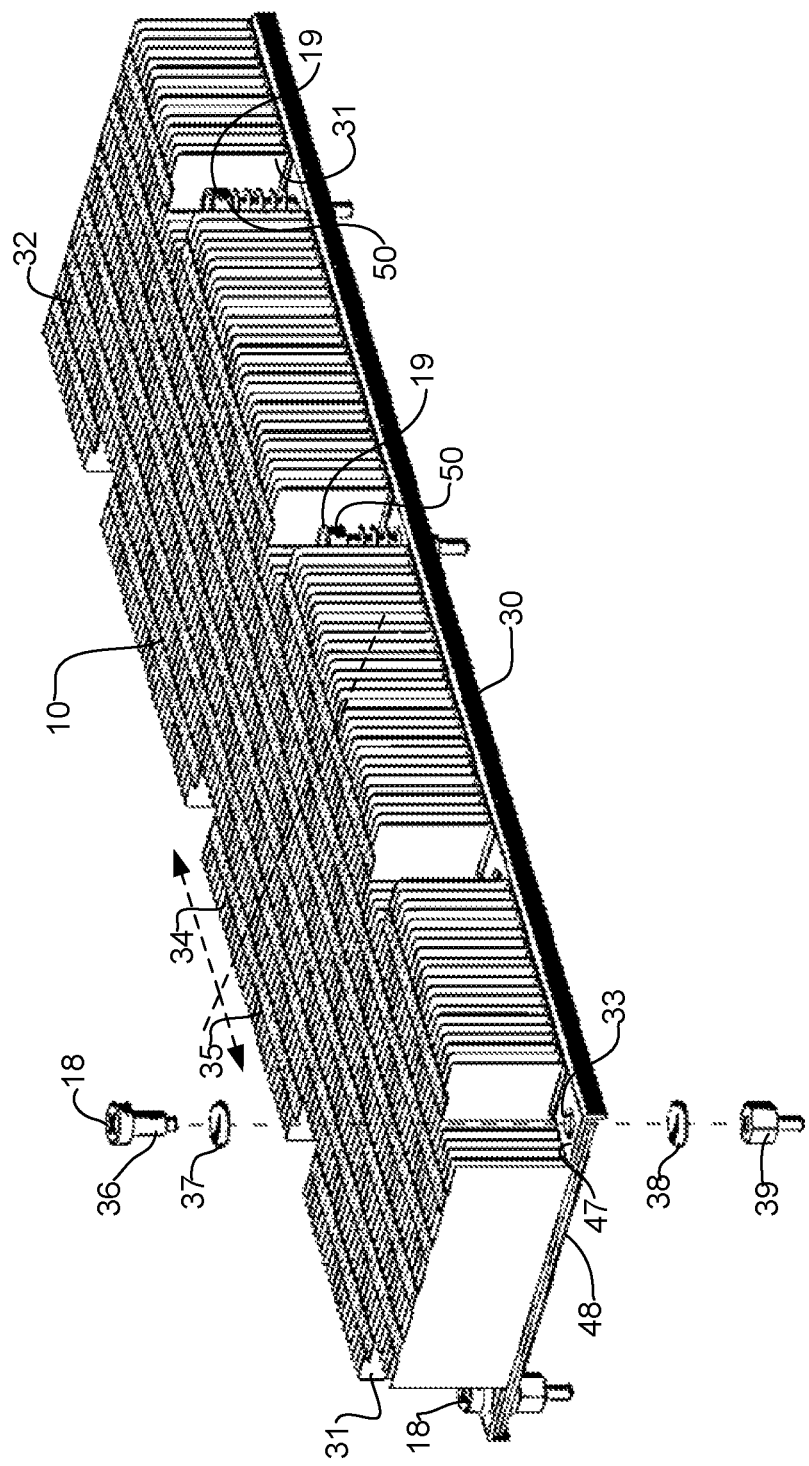
FIG. 3 is a perspective of the heatsink and a heatsink mounting system, in accordance with one embodiment.

FIG. 3 is a perspective of the heatsink 10 and mounting system, in accordance with one embodiment. The heatsink 10 includes a base plate (base) 30 and a plurality of fins 32 extending upward from the base plate. The base plate 30 couples the electronic component to the heatsink 10 and airflow (e.g., provided by one or more fans) flows across the fins 32. The base plate 30 transfers the heat to the fins 32 and the airflow carries heat away from the heatsink as it travels past the fins, thereby cooling the electronic component. As previously noted, the heatsink 10 may include a two-phase cooling device such as a vapor chamber or heat pipes to further improve thermal efficiency of the heatsink.

The heatsink 10 includes a symmetrical portion 34 mounted above and proximate to the electronic component 20 and an overhang portion 35 that is asymmetrical relative to the underlying electronic component (FIGS. 2 and 3). The base 30 comprises a plurality of openings 33 corresponding to attachment points on the circuit board 12 (e.g., 22 and 24 in FIG. 2). At the location of each of the openings 33, a portion of a body of the heatsink (comprising fins 32) is recessed to create an opening 31 for ease of access of the connector 18 or fastener 19 (insertion, removal of coupling components). These hollow (recessed) portions 31 in the heatsink body are shown as vertical rectangular cubes above each of the openings 33, however, different shapes may be used to form the cutout portions in the heatsink body.

Coupling components (fasteners) 19 for mounting the symmetric portion 34 of the heatsink 10 may include, for example, a spring loaded screw, spring loaded plunger, clip, and the like. In the example shown in FIG. 3, four spring loaded screws 50 attach the symmetric portion 34 of the heatsink to the circuit board 12 over the ASIC 20 at mounting locations 22 (FIGS. 2 and 3).

Figure 6:
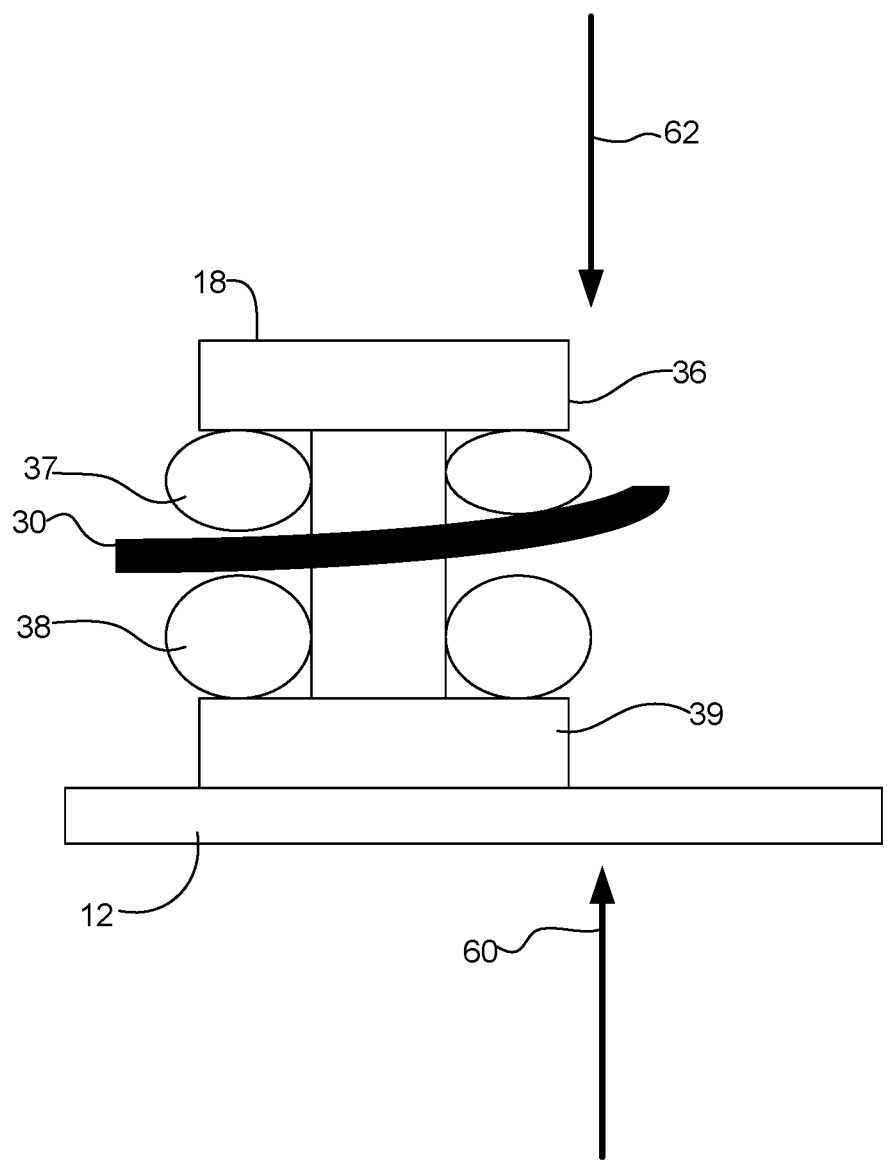
FIG. 6 is a schematic illustrating forces on the heatsink and a damping connector during shock or vibration, in accordance with one embodiment.

The damping connectors (connector assemblies) 18 attach the overhang portion 35 of the heatsink 10 to the circuit board at mounting points 24 (FIGS. 2 and 3). Each damping connector 18 comprises a first O-ring 37 for positioning adjacent to an upper surface 47 of the base 30 of the heatsink 10, a second O-ring 38 for positioning adjacent to a lower surface 48 of the base of the heatsink, and a connecting member extending through aligned openings in the first O-ring 37, second O-ring 38, and the base 30 of the heatsink for attachment to the circuit board. In the example shown in FIG. 3, the connecting member comprises a first screw 36 for mating with a second screw 39. As described below with respect to FIG. 4, the O-rings 37, 38 are supported by shoulders on the two mating screws 36, 39 and help to quickly reduce the amplitude of shock and vibration at the heatsink 10. The damping connectors 18 allow the spring loaded fasteners 19 to provide heatsink to ASIC contact while the end cantilever effect is addressed by the damping connectors. The damping connectors 18 absorb the cantilever force (dynamic energy) created during vibration or shock at the heatsink 10, as described below with respect to FIG. 6.

The O-rings 37, 38 may comprise, for example, rubber O-rings (e.g., EPDM (ethylene propylene diene monomer), EPR (ethylene propylene rubber), Neoprene, or any other suitable material) configured to withstand thermal conditions in the heatsink environment and provide sufficient damping. It is to be understood that the term O-ring as used herein refers to any compressible element having a central opening and any cross-sectional shape (e.g., circular, oval, rectangular). The two-piece damping design allows for optimization of damping with a wide range of O-ring selection (e.g., material, durometer, size, shape) along with number and location of damping connectors.

In one example, the heatsink base 30 has a width of 3.4 inches, length of 11.5 inches (aspect ratio of approximately 1:3), a thickness of 1 inch, and a weight of 1.8 pounds. It is to be understood that this is only an example and the heatsink may have other shapes, sizes, weights, or aspect ratios. Also, as previously noted, the number and arrangement of connectors 18 and fasteners 19 and connectors shown in FIG. 3 is only an example and a different number of connectors or fasteners, or different mounting locations may be used without departing from the scope of the embodiments.

Figure 4:
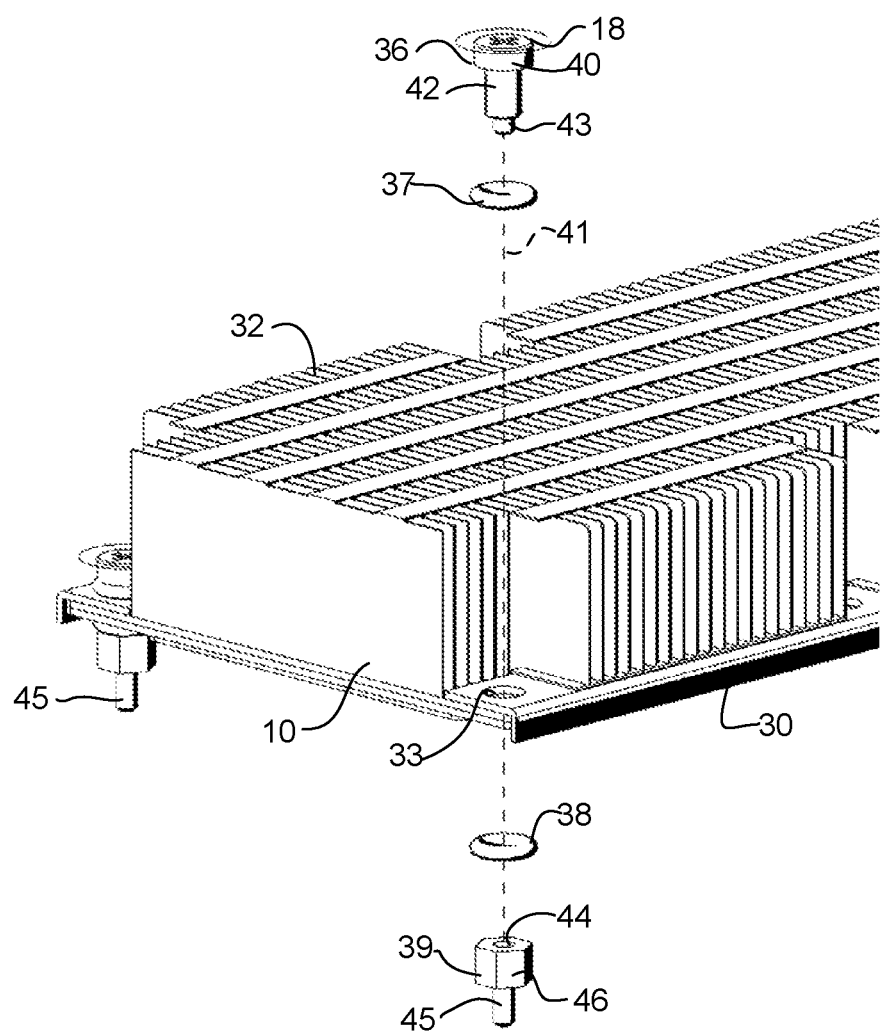
FIG. 4 is an enlarged partial view of the heatsink and mounting system shown in FIG. 3.

FIG. 4 is an enlarged partial perspective of the heat sink 10 and damping connectors 18 shown in FIG. 3. As shown in the exploded view of the damping connector 18, the screw 36 comprises a shaft 42 defining a longitudinal axis 41 and a flange/shoulder (head) 40 extending substantially perpendicular to the axis 41 of the connector 18. Each of the O-rings (compressible members) 37, 38 defines an aperture (opening) for receiving the shaft 42 of the connecting member and encircles the shaft. The flange 40 provides a mating shoulder for the O-ring 37 on its underside. A tip 43 of the screw 36 is received in an opening 44 formed in a top surface of a head 46 of the mating screw 39, which provides a shoulder for the lower O-ring 38. The screw 39 comprises a shaft 45 for attachment to the circuit board 12, as shown in FIG. 5.

Figure 5:
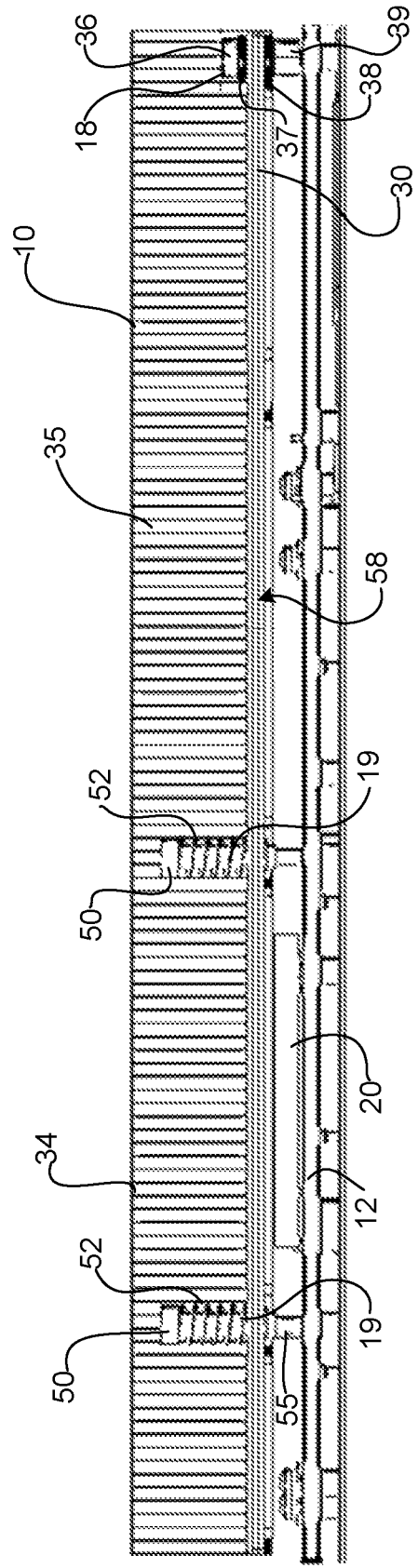
FIG. 5 is a side view of the heatsink mounted on the circuit board with the mounting system.

FIG. 5 is a side view of the heatsink 10 attached to the circuit board 12 with the ASIC 20 interposed therebetween. As previously described, the symmetric portion 34 of the heatsink 10 is attached to the circuit board 12 with fasteners 19 comprising the screw 50 inserted into a spring 52. A shaft 55 of the screw extends through the base 30 of the heatsink 10 and into an aligned opening in the circuit board 12. The fasteners 19 are positioned generally adjacent to the ASIC 20. The damping connectors 18 are positioned along an edge of the overhang portion 35 of the heatsink 10 and extend through the base 30 of the heatsink 10 and into the circuit board 12. The overhang portion 35 of the heatsink 10 extends beyond an edge of the underlying ASIC parallel to the circuit board, creating an empty space between the overhang and the circuit board. As previously noted, the base 30 of the heatsink 10 may include a two-phase component (e.g., vapor chamber, heat pipes), generally indicated at 58 (details not shown).

It is to be understood that the number of damping connectors 18 and mounting locations shown in FIGS. 1-5 is only an example and that the heatsink mounting system may comprise any number of damping connectors (e.g., 1, 2, 3, 4. . .) positioned in any arrangement, without departing from the scope of the embodiments. For example, while only two damping connectors 18 are shown located along an edge of the overhang portion 35 of the heatsink 10 at opposite corners, additional damping connectors may also be inserted in the opening spaced from the edge in the overhang portion of the heatsink (shown in FIG. 3).

The O-rings 37, 38 are installed in an uncompressed state to provide zero static force (load) on the heatsink 10. In the uncompressed (free, relaxed) state, the O-rings 37, 38 subject no force on the heatsink 10. When the heatsink begins to flex due to G force from shock or vibration, as indicated at arrow 60 in FIG. 6, the O-ring 37 reacts with a counter force, indicated at arrow 62 to prevent flexing of the heatsink along the length of the heatsink and maintain the heatsink base 30 in a generally straight (planar) position along the length of the base. The lower O-ring 38 similarly reacts against the heatsink base 30 upon contact to absorb energy created due to dynamic loading from shock or vibration at the heatsink. The small cross-section of the O-rings 37, 38 provide a reaction force with a small amount of compression. Since the O-rings 37, 38 are installed with no initial compression or deformation there is zero net force at installation (zero static loading on the heatsink due to the damping connector).

As can be observed from the foregoing, the heatsink mounting system described herein provides many advantages. For example, in one or more embodiments, the damping connector 18 provides damping to reduce the amplitude of vibration or shock quickly and effectively, thereby resolving cantilever issues with asymmetric heatsinks. One or more embodiments also maintain spring forces from fasteners closer to the ASIC (or other electronic device) to ensure optimum contact. One or more embodiments allow for optimum heatsink thermal performance by allowing for proper mechanical support for two-phase heatsink components such as vapor chamber and heat pipes. One or more embodiments provide minimal impact on board layout since only two regular sized mounting holes are needed on the circuit board, also providing minimal cost and manufacturing impact.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A heatsink mounting system comprising:
  a plurality of fasteners for attaching the heatsink to a circuit board at a location proximate to an electronic component interposed between the circuit board and the heatsink; and
  a damping connector for attaching an overhang portion of the heatsink to the circuit board, the damping connector comprising:
    a first O-ring for positioning adjacent to an upper surface of a base of the heatsink;
    a second O-ring independent from said first O-ring for positioning adjacent to a lower surface of the base of the heatsink; and
    a connecting member for extending through aligned openings in said first O-ring, said second O-ring, and the base of the heatsink;
    wherein the damping connector is operable to absorb energy during vibration or shock at the heatsink to prevent flexing of the heatsink along a length of the heatsink, and wherein each of said first and second O-rings is unrestrained around an outer circumference of said first or second O-ring and installed in an uncompressed state to provide zero static load on the heatsink.

2. The heatsink mounting system of claim 1 wherein the connecting member comprises two mating connectors each comprising a shoulder for supporting said first O-ring or said second O-ring.

3. The heatsink mounting system of claim 1 wherein the fasteners comprise four spring loaded screws.

4. The heatsink mounting system of claim 1 wherein the damping connector comprises two damping connectors positioned along an edge of said overhang portion of the heatsink.

5. The heatsink mounting system of claim 1 wherein the heatsink base comprises a two-phase device to remove heat generated by the electronic component.

6. The heatsink mounting system of claim 5 wherein the two-phase device comprises a vapor chamber.

7. The heatsink mounting system of claim 1 wherein the heatsink comprises a plurality of fins extending from the base and the damping connector comprises two damping connectors positioned at corners of said overhang portion of the heatsink and aligned with a cutout portion of the fins at each of said corners.

8. The heatsink mounting system of claim 1 wherein the heatsink has an aspect ratio of a width to length of at least one to three.

9. An apparatus comprising:
  a heatsink;
  a plurality of fasteners for attaching the heatsink to a circuit board at a location proximate to an electronic component interposed between the circuit board and the heatsink; and
  a damping connector for attaching an overhang portion of the heatsink to the circuit board, the damping connector comprising:
    a first O-ring adjacent to an upper surface of a base of the heatsink;
    a second O-ring independent from said first O-ring and adjacent to a lower surface of the base of the heatsink; and a connecting member extending through aligned openings in said first O-ring, said second O-ring, and the base of the heatsink;

wherein the damping connector is operable to absorb energy during vibration or shock at the heatsink to prevent flexing of the heatsink along a length of the heatsink, and wherein each of said first and second O-rings is unrestrained around an outer circumference of said first or second O-ring and installed in an uncompressed state to provide zero static load on the heatsink.

10. The apparatus of claim 9 wherein the connecting member comprises two mating connectors each comprising a shoulder for supporting said first O-ring or said second O-ring.

11. The apparatus of claim 9 wherein the damping connector comprises two damping connectors positioned along an edge of said overhang portion of the heatsink.

12. The apparatus of claim 9 wherein the heatsink base comprises a two-phase device to remove heat generated by the electronic component.

13. An apparatus comprising:
a circuit board;
a heatsink mounted on the circuit board;
a plurality of fasteners attaching the heatsink to the circuit board at a location proximate to an electronic component interposed between the circuit board and the heatsink; and
a damping connector attaching an overhang portion of the heatsink to the circuit board, the damping connector comprising:
a first O-ring adjacent to an upper surface of a base of the heatsink;
a second O-ring independent from said first O-ring and adjacent to a lower surface of the base of the heatsink; and
a connecting member extending through aligned openings in said first O-ring, said second O-ring, and the base of the heatsink and attached to the circuit board;
wherein the damping connector is operable to absorb energy during vibration or shock at the heatsink to prevent flexing of the heatsink along a length of the heatsink, and wherein each of said first and second O-rings is unrestrained around an outer circumference of said first or second O-ring and installed in an uncompressed state to provide zero static load on the heatsink.

14. The apparatus of claim 13 wherein the damping connector comprises two damping connectors positioned at corners of said overhang portion of the heatsink.

15. The apparatus of claim 13 wherein the heatsink base comprises a two-phase device to remove heat generated by the electronic component.

16. The apparatus of claim 13 wherein the fasteners comprise four spring loaded screws and the damping connector comprises two damping connectors.

17. The apparatus of claim 13 wherein each of said first and second O-rings is positioned between a flat surface of the heatsink base and a flange defined by a screw head.

* * * * *